(12) United States Patent
d'Abreu et al.

(10) Patent No.: US 10,026,464 B2
(45) Date of Patent: Jul. 17, 2018

(54) DEVICES, SYSTEMS, AND METHODS FOR INCREASING THE USABLE LIFE OF A STORAGE SYSTEM BY OPTIMIZING THE ENERGY OF STORED DATA

(71) Applicant: Smart IOPS, Inc., Milpitas, CA (US)

(72) Inventors: Manuel Antonio d'Abreu, El Dorado Hills, CA (US); Ashutosh Kumar Das, Cupertino, CA (US)

(73) Assignee: SMART IOPS, INC., Milpitas, CA (US)

( * ) Notice: Subject to any disclaimer, the term of this patent is extended or adjusted under 35 U.S.C. 154(b) by 0 days.

(21) Appl. No.: 15/732,038

(22) Filed: Sep. 6, 2017

(65) Prior Publication Data

US 2018/0068701 A1  Mar. 8, 2018

Related U.S. Application Data

(60) Provisional application No. 62/383,977, filed on Sep. 6, 2016.

(51) Int. Cl.
| | |
|---|---|
| G11B 5/09 | (2006.01) |
| G11C 8/14 | (2006.01) |
| G11B 19/02 | (2006.01) |
| G11C 8/12 | (2006.01) |
| H03M 13/00 | (2006.01) |
| G06F 11/10 | (2006.01) |

(52) U.S. Cl.
CPC ............. *G11C 8/14* (2013.01); *G11B 19/02* (2013.01); *G11C 8/12* (2013.01); *H03M 13/6331* (2013.01); *G06F 11/1044* (2013.01)

(58) Field of Classification Search
None
See application file for complete search history.

(56) References Cited

U.S. PATENT DOCUMENTS

| | | | | |
|---|---|---|---|---|
| 5,757,822 | A * | 5/1998 | Fisher | G11B 20/10009 341/58 |
| 5,841,781 | A * | 11/1998 | Takeda | G11B 20/1866 714/701 |
| 6,587,408 | B1 * | 7/2003 | Jacobson | G11B 5/743 250/442.11 |
| 2006/0268913 | A1 * | 11/2006 | Singh | H04L 49/90 370/412 |
| 2013/0139023 | A1 * | 5/2013 | Han | G11B 20/1833 714/752 |

* cited by examiner

*Primary Examiner* — Peter Vincent Agustin
(74) *Attorney, Agent, or Firm* — Willink & Hunt LLP; Marcus T. Hunt

(57) ABSTRACT

In certain aspects, a device may include a memory and a controller coupled to the memory. The controller may be configured to process data to form codewords and to send the codewords to the memory to be stored at locations of the memory. The controller may encode and tag the incoming data (from the host) to minimize the charge that is required to be stored in the non-volatile memory.

23 Claims, 5 Drawing Sheets

DEVICES, SYSTEMS, AND METHODS FOR INCREASING THE USABLE LIFE OF A STORAGE SYSTEM BY OPTIMIZING THE ENERGY OF STORED DATA

CROSS-REFERENCE TO RELATED APPLICATIONS

This application claims benefit under 35 U.S.C. § 119(e) of U.S. Provisional Application No. 62/383,977, filed Sep. 6, 2016, the entirety of which is incorporated herein by reference.

FIELD

The present disclosure is generally related to memory, and more particularly to maintaining endurance, reducing energy in stored data, and data integrity as memory degrades. The present disclosure may be applicable in the fields of storage, networking, communications, computing systems, and design of reliable systems, non-volatile memory systems based on Flash, ReRAM, MRAM, 3D and 2D non-volatile devices, and Internet of Things (IoT) systems, for example.

BACKGROUND

With advances in flash memory technology, device types, and memory fabrication, the energy required to store data in memory plays a major role in the wear out of memory. This can negatively impact the endurance of the memory, the capability to retain data over period of time, and many other erroneous manifestations.

SUMMARY

In certain aspects of the present disclosure, data storage devices are provided that include a memory device and controller. The memory device includes memory. The controller is communicatively coupled to the memory device and includes logic to assemble a plurality of equalized data packets such that each of the equalized data packets is for a different page in a plurality of pages of a memory; shuffle one or more bits in the assembled plurality of equalized data packets to form an optimized data packet; and store the optimized data packet in the memory. The shuffling of the one or more bits reduces an amount of energy to be stored in the memory while maintaining equalization.

In certain aspects of the present disclosure, a system is provided that includes a data storage device and a host accessing device communicatively coupled to the data storage device. The host accessing device is configured to issue commands to the data storage device to read data from or write data to the memory device. The data storage device includes a memory device including memory, and a controller communicatively coupled to the memory device. The controller includes logic to assemble a plurality of equalized data packets such that each of the equalized data packets is for a different page in a plurality of pages of a memory; shuffle one or more bits in the assembled plurality of equalized data packets to form an optimized data packet, and store the optimized data packet in the memory. The shuffling of the one or more bits reduces an amount of energy to be stored in the memory while maintaining equalization.

In certain aspects of the present disclosure, methods are provided that include: assembling, by a controller, a plurality of equalized data packets such that each of the equalized data packets is for a different page in a plurality of pages of a memory; shuffling, by the controller, one or more bits in the assembled plurality of equalized data packets to form an optimized data packet, and storing, by the controller, the optimized data packet in the memory. The shuffling of the one or more bits reduces an amount of energy to be stored in the memory while maintaining equalization.

BRIEF DESCRIPTION OF THE DRAWINGS

For a better understanding of at least an embodiment, reference will be made to the following Detailed Description, which is to be read in conjunction with the accompanying drawings, wherein.

DETAILED DESCRIPTION

Figure 1:
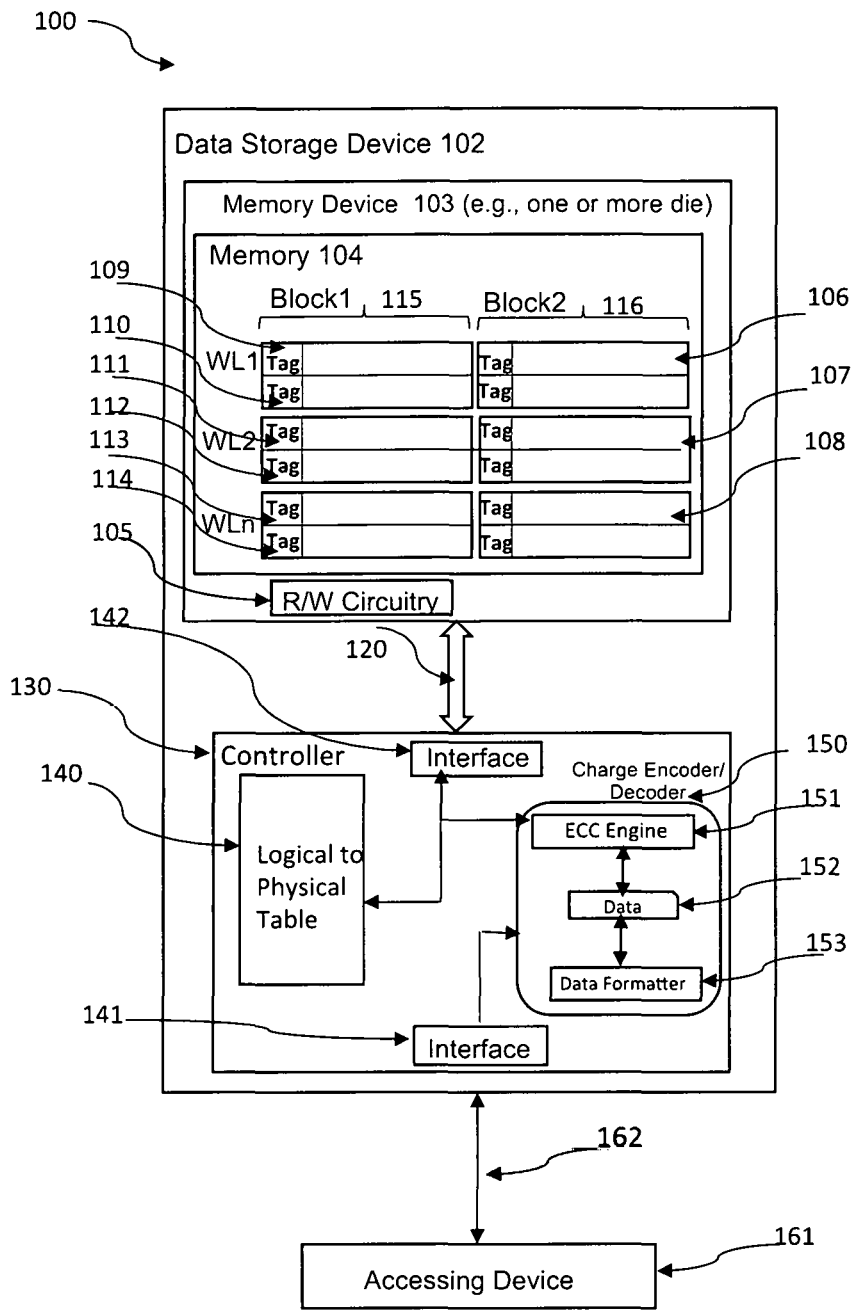
FIG. 1 illustrates a block diagram of an exemplary memory system configured to program a memory according to a programming scheme, according to an embodiment.

Particular aspects of the present disclosure are described below with reference to the drawings. In the description, common features are designated by common reference numbers. Although certain examples are described herein with reference to data storage systems, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "exemplary" may indicate an example, an implementation, and/or an aspect, and should not be construed as limiting or as indicating a preference or a preferred example, implementation, and/or aspect.

In some aspects of the present disclosure, balancing and minimizing charge is utilized in programming memory cells. The amount of charge that is programmed into a flash memory cell impacts the life of the cell since the erase procedure is harder when the amount of charge is larger. Thus, balancing and minimizing the amount of charge programmed across all the cells in a wordline can be utilized to increase the life or endurance of the memory device.

In certain aspects, the present disclosure provides devices, systems, and methods of programming data to, or reading data from, a memory card or a set of memory cards, according to data error tracking on the memory card or storage system. For example, a controller of a data storage device may receive a data packet to be stored in a number of memory devices. The controller may partition the data word into multiple portions and the multiple portions may be interleaved across multiple memory devices. Also, the controller may simultaneously start parallel reads from several memory devices. Additionally, prior to the multiple data packets being stored into, or read from, the memory card, a logical address corresponding to the data packets may be mapped to multiple physical addresses that indicate where each of the multiple data packets is to be stored in, or read from, the memory card or the storage system. The writing of data and reading of data can be performed simultaneously across several memory cards in the storage system. Data to be stored in the memory storage system is encoded to minimize the charge to be programmed into the storage system. Also, when the data is read from the storage system, the data may be decoded to its normal state prior to the charge optimization encoding.

FIG. 1 illustrates a block diagram of an exemplary memory system configured to program a memory according to a programming scheme, according to an embodiment.

FIG. 1 shows a storage system 100 that includes a data storage device 102 and a host accessing device 161, according to an embodiment. The data storage device 102 includes a controller 130 (e.g., a memory controller) and a memory device 103 that is coupled to the controller 130. The memory controller manages the operation of memory storage. The memory device 103 may include one or more memory dies. The memory device 103 may include 2D-Flash, 3D-Flash, ReRAM, MRAM, and any other 2D or 3D non-volatile memory technology, for example.

The data storage device 102 and the host accessing device 161 may be coupled via a connection 162 (e.g., a communication path), such as a bus or a wireless connection. The data storage device 102 may include an interface 141 (e.g., a host accessing device interface) that enables communication via the connection 162 between the data storage device 102 and the host accessing device 161.

In some embodiments, the data storage device 102 may be embedded within the host accessing device 161, such as in accordance with a Joint Electron Devices Engineering Council (JEDEC) Solid State Technology Association Universal Flash Storage (UFS) configuration. For example, the data storage device 102 may be configured to be coupled to the host accessing device 161 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the host accessing device 161 (i.e., "removably" coupled to the host accessing device 161). As an example, the data storage device 102 may be coupled to the host accessing device 161 in accordance with a removable universal serial bus (USB) configuration.

In some embodiments, the data storage device 102 may include or correspond to a solid state drive (SSD) that may be included in, or distinct from (and accessible to), the host accessing device 161. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the host accessing device 161 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The host accessing device 161 may include a processor and a memory. The memory may be configured to store data and/or instructions that may be executable by the processor. The memory may be a single memory or may include multiple memories, such as one or more non-volatile memories, one or more volatile memories, or a combination thereof. The host accessing device 161 may issue one or more commands to the data storage device 102, such as one or more requests to erase data, read data from, or write data to the memory device 103 of the data storage device 102. The accessing device 161 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations the memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks, such as one or more NAND flash erase blocks. To illustrate, the memory 104 may include at least one block of storage elements (e.g., also referred to herein as memory cells). Each storage element of the memory 104 may be programmable to a state (e.g., a threshold voltage in a flash configuration or a resistive state in a resistive memory configuration) that indicates one or more values. In some implementations, the memory 104 may include multiple pages 115,116. Each page of the memory 104 may include one or more blocks, such as a first block 106, a second block 107, and a third block 108. Each block consists of one or more wordlines (not shown). Although the memory 104 is illustrated as having two pages each page having 3 blocks, in other implementations, the memory 104 may include more than three blocks or fewer than three blocks. A memory may be configurable to operate as a single-level-cell (SLC) word line, as a multi-level-cell (MLC) word line, or as a tri-level-cell (TLC) word line, as illustrative, non-limiting examples.

The memory device 104 may include support circuitry, such as read/write circuitry 105, to support operation of one or more memory dies of the data storage device 102. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via the connection 120 (e.g., a bus), an interface, another structure, or a combination thereof. For example, the connection 120 may include a bus having one or more channels to enable the controller 130 to communicate with a single memory die of the memory device 103. As another example, the connection 120 may include a bus having multiple distinct channels to enable the controller 130 to communicate with each memory die of the memory device 103 in parallel with, and independently of, communication with other memory dies of the memory device 103. The controller 130 is configured to receive data and instructions from the host accessing device 161 and to send data to the host accessing device 161. For example, the controller 130 may send data to the host accessing device 161 via the interface 141 and the connection 162, and the controller 130 may receive data from the host accessing device 161 via the interface 141 and the connection 162. The controller 130 is configured to send data and commands to the memory 104 and to receive data from the memory 104. For example, the controller 130 may be configured to send data and a write command to cause the memory 104 to store data to an address of the memory 104. The write command may specify a physical address of a portion of the memory 104 (e.g., a physical address of a word line of the memory 104) that is to store the data. The controller 130 may implement a logical to physical address mapping table 140 that includes a mapping of the logical addresses to the physical addresses in the memory. The controller 130 may also be configured to send data and commands to the memory 104 associated with background scanning operations, garbage collection operations, and/or wear leveling operations, etc., as illustrative, non-limiting examples. The controller 130 may be configured to send a read command to the memory 104 to access data from a specified address of the memory 104. The read command may specify the physical address of a portion of the memory 104 (e.g., a physical address of a word line of the memory 104).

The controller 130 shown includes a charge encoder/decoder module 150 and the logical to physical address mapping table 140. The controller 130 is configured to process data (e.g., data from a data register 152), to form one or more codewords to be stored at the memory 104. Storage elements that are indicated as not used for data storage may remain in an erased state (e.g., in a flash memory implementation where storage elements are erased before being programmed) or may store dummy data. For example, storing dummy data in unused storage elements may enhance an endurance of the memory 104 as compared to leaving the unused storage elements in an erased state.

The charge encoder/decoder module 150 shown includes an ECC engine module 151, the data register 152, and a data formatter module 153. The data register 152 may receive and include the data to be processed. The ECC engine module 151 of the charge encoder/decoder module 150 adds ECC parity to the data in the data register 152. The data may then pass to the data formatter 153 for a second stage of encoding and decoding. The second stage encoding and decoding may include energy reduction analysis and optimization for the data to be programmed in the memory 104.

The ECC encoding and decoding is performed by the ECC engine module 151. During the ECC encoding, the ECC engine module 151 receives the data to be encoded from the data register 152, which receives the data from the host accessing device 161 via interface block 141. Once the ECC encoding is performed, the encoded data is sent to the data formatter 153.

The data formatter 153 receives the encoded data, further encodes the data to optimize (or reduce) the programming charge to be stored in the memory 104, and sets the tags 109, 110, 111, 112, 113 and 114 to indicate how the encoding was performed, which may be utilized for decoding purposes. Once the data undergoes the charge optimization encoding and the ECC encoding, the data is sent to be programmed in the memory 104.

When the data is read from the memory 104, the data formatter 153 decodes the data using the tags 109-114. It should be appreciated that the tags 109-114 are illustrative and are not necessarily an exhaustive set of tags. Each word line may have one or more tags associated with it. Once the data formatter 153 restores the data to its original state, the data is sent to the ECC Engine module 151 to decode the ECC parity. Once the ECC parity is decoded, the data may reside in the data register 152 to be sent to the host accessing device 161 through the interface 141.

The ECC engine module 151 may include an encoder (e.g., an encoder for charge optimizer module 230 of FIG. 2) configured to encode the multiple data words using an ECC encoding technique. The ECC engine 151 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine module 151 may also include a decoder (e.g., a decoder for charge optimizer module 220 of FIG. 2) that decodes an incoming data packet, identifies errors that must be corrected, and corrects the errors.

Figure 2:
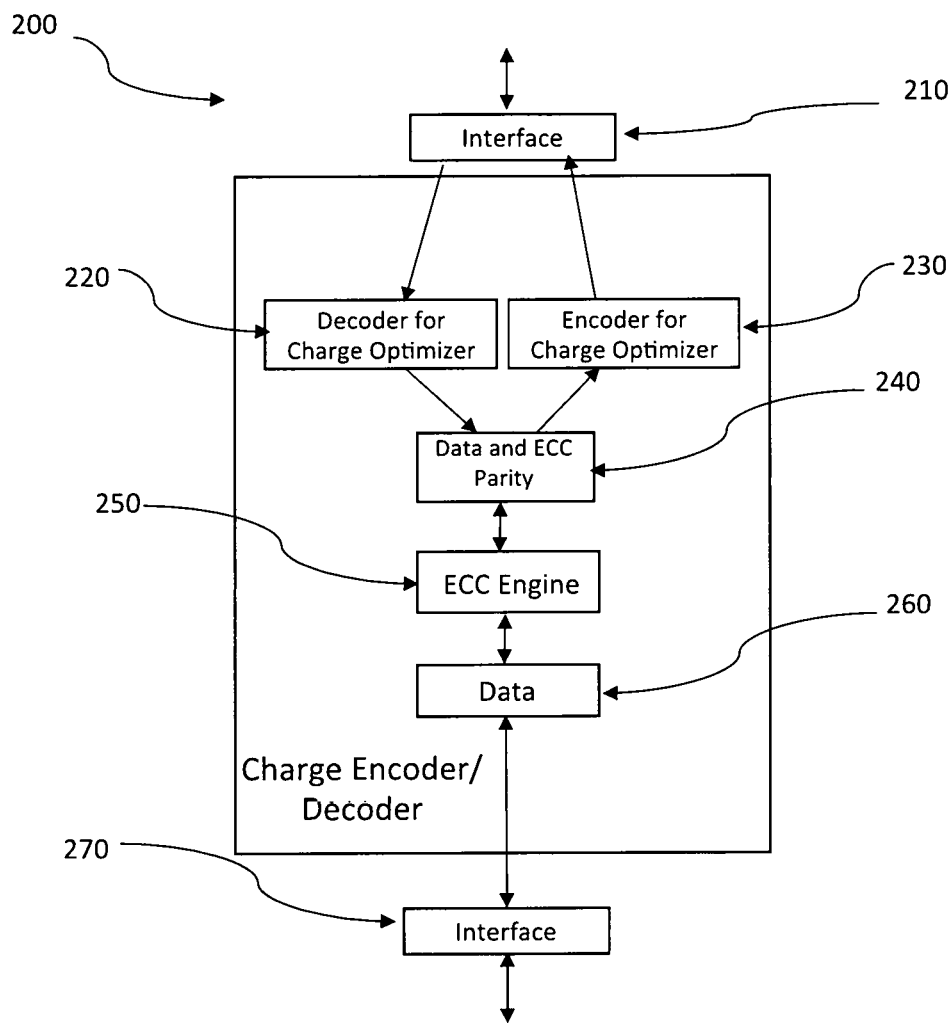
FIG. 2 illustrates a block diagram of an exemplary charge encoder/decoder module, according to an embodiment.

FIG. 2 illustrates a block diagram of an exemplary charge encoder/decoder module, according to an embodiment. FIG.

2 shows a charge encoder/decoder module 200 that may perform the data encoding and tagging when writing data into a memory (e.g., the memory 104 shown in FIG. 1), and the decoding of data when reading data from the memory. The charge encoder/decoder module 200 may also incorporate encoding and decoding of the ECC parity. In an embodiment, the charge encoder/decoder module 200 may be implemented as the charge encoder/decoder 150 shown in FIG. 1. With this in mind, FIG. 2 may also be described with reference to the description of FIG. 1.

The charge encoder/decoder module 200 shown is coupled to an interface 210 (e.g., interface 120 in FIG. 1), which is utilized to send and receive data to and from the memory (e.g., the memory 104 in FIG. 1).

The charge encoder/decoder module 200 is shown including two optimizing modules—a decoder for charge optimizer module 220, and an encoder for charge optimizer module 230. In an embodiment, the decoder for charge optimizer module 220 and the encoder for charge optimizer module 230 may be implemented in the data formatter 153 of FIG. 1.

The decoder for charge optimizer module 220 decodes the data that is read from the memory 104. The decoding is based on the information (e.g., decoding instructions) in tags (e.g., the tags 109-114 of FIG. 1.) added to the data packet during the encoding process performed by the encoder for charge optimizer module 230.

The encoder for charge optimizer module 230 receives data from the host accessing device 161, along with the ECC parity generated by an ECC engine module 250, and then encodes the data and the ECC parity to reduce the charge that is programmed in the memory 104. The encoder for charge optimizer module 230 may also add the appropriate tags (e.g., the tags 109-114 in FIG. 1) that indicate how the data was encoded. These tags are used in the decoding step when the data is read from the memory 104 via the interface 210 (e.g., interface 120 in FIG. 1).

The charge encoder/decoder module 200 shown also includes a data and ECC parity module 240 that may include a data register (e.g., the data register 152 of FIG. 1) that holds the data and the added ECC in both the encoding process and the decoding process.

The charge encoder/decoder module 200 shown also includes the ECC engine module 250 (e.g., the ECC engine module 151 of FIG. 1). The ECC engine module 250 may be configured to encode multiple data words to form codewords. To illustrate, the ECC engine module 250 may include an encoder configured to encode the multiple data words using an ECC encoding technique. The ECC engine module 250 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The charge encoder/decoder module 200 shown also includes a data register 260 (e.g., the data register 152 of FIG. 1) to hold data received from the host, or data to be sent to the host. The charge encoder/decoder module 200 is also shown coupled to an interface 270 (e.g., interface 141), which is utilized for communications to and from the host accessing device (e.g., host accessing device 141 in FIG. 1).

Figure 3:
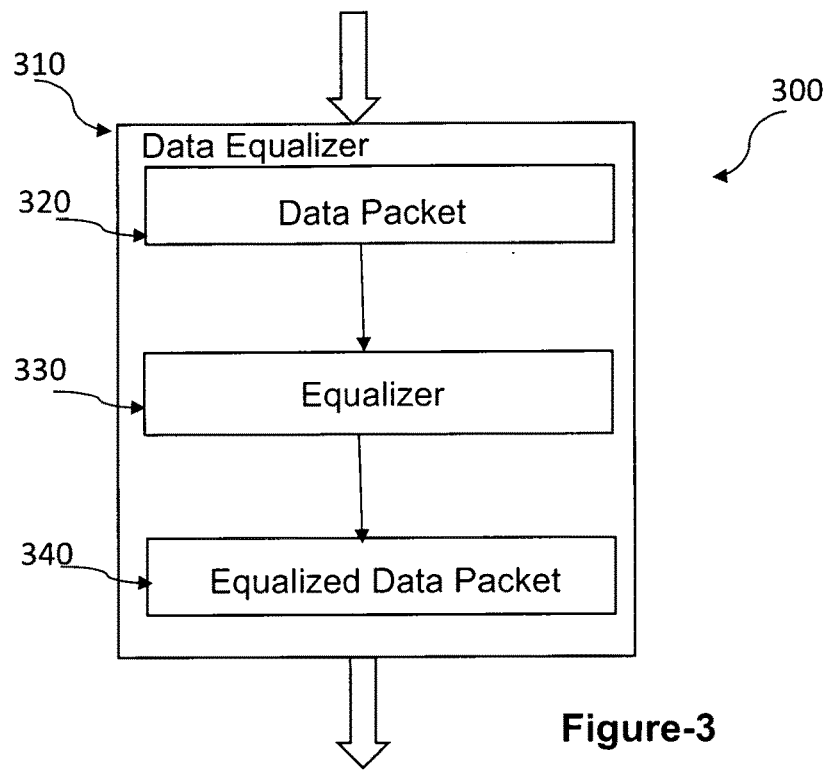
FIG. 3 illustrates a block diagram of an exemplary data flow in a data equalizer module, according to an embodiment.

The charge encoding and decoding may include data equalization and charge optimization, as will be described in further detail in FIGS. 3 and 4. FIG. 3 illustrates a block diagram of an exemplary data flow 300 in a data equalizer module 310, according to an embodiment. In an embodiment, the data flow 300 and the data equalizer module 310 may be implemented in the encoder for charge optimizer module 230 shown in FIG. 2 and in the data formatter module 153 shown in FIG. 1. Therefore, the descriptions for FIGS. 1 and 2 may also be applicable here. The data equalizer module 310 may be utilized to optimally encode data to achieve a desired mix of balanced ones and zeros, according to an embodiment. The optimal encoding is performed on the data that is to be programmed into the memory device.

As shown in FIG. 3, the data equalizer module 310 receives a data packet 320 that is to be equalized. The data packet 320 may be received from the data register 152 in FIG. 1 for instance. When equalized, the number of zeros and ones in the data are encoded to achieve optimum balance. The data equalizer module 310 includes an equalizer module 330 that performs the data encoding to equalize the data packet 320. The equalized data is then transferred to a data register as an equalized data packet 340.

Figure 4:
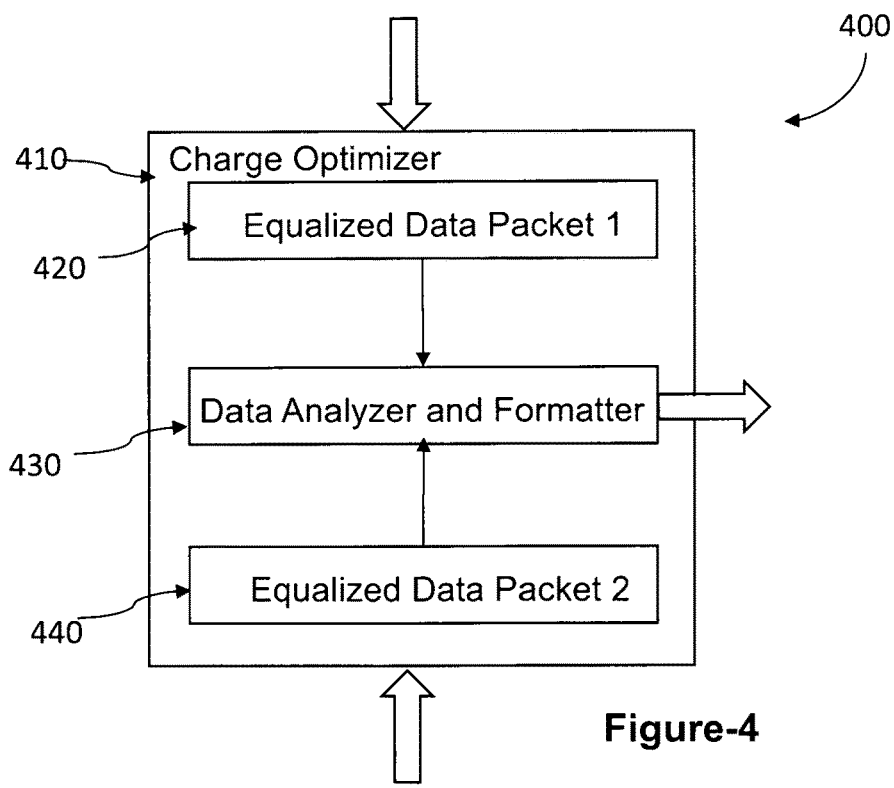
FIG. 4 illustrates a block diagram of an exemplary data flow in a charge optimizer, according to an embodiment.

FIG. 4 illustrates a block diagram of an exemplary data flow 400 in a charge optimizer 410, according to an embodiment. In an embodiment, the data flow 400 and the charge optimizer module 410 may be implemented in the encoder for charge optimizer module 230 shown in FIG. 2 and the data formatter module 153 in FIG. 1. Therefore, the descriptions for FIGS. 1 and 2 may also be applicable here. The charge optimizer module 410 may be utilized to reduce the amount of charge programmed into a wordline or group of wordlines (or block of wordlines). This operation may be performed on the data that is to be programmed into a memory device. The data flow 400 is an illustrative non-limiting example.

In FIG. 4, the charge optimizer module 410 is shown receiving as input two data packets (shown as equalized data packets 1 and 2) that have been equalized, such as performed in the data flow 300 for the data equalizer module 310 in FIG. 3. The two equalized data packets 1 and 2 are shown residing in registers in modules 420 and 440, respectively, before being sent to the charge optimizer module 410.

The charge optimizer module 410 is shown including a data analyzer and formatter module 430 that is utilized to store the two equalized data packets 1 and 2 in a wordline as upper and lower pages—e.g., when a memory cell stores two bits of information per cell. If the memory cell stores more bits per cell, then the number of equalized data packets that are to be analyzed for charge reduction will increase accordingly. As an example, three equalized data packets are required to program a memory cell that stores three bits per cell. The data analyzer and formatter module 430 receives as input the equalized data packets 1 and 2 in registers 420 and 440, and then shuffles the equalized data packets 1 and 2 so as to reduce the energy stored for charges in one or more cells in the wordline. In an embodiment, the equalized data packets 1 and 2 are shuffled so as to reduce or minimize the number of cells that have to be programmed to full charge. Based on the shuffling scheme, a set of tags is generated by the data analyzer and formatter module 430. The tags are stored along with the equalized and shuffled data packets and may include information as to the shuffling scheme, which may be used in the decoding process.

Figure 5:
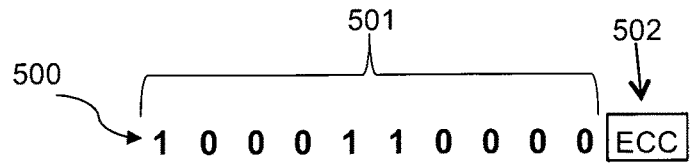
FIG. 5 illustrates an exemplary data packet to be programmed in the memory, according to an embodiment.

FIG. 5 illustrates a data packet 500 that is to be programmed in memory (e.g., the memory 104 of FIG. 1), according to an embodiment. The data packet 500 includes data (e.g., raw data) 501 and ECC 502. The data 501 in the data packet 500 is not balanced—i.e., the number of 0's is greater then the number of 1's. For example, the data 501 includes three 1's and seven 0's.

Figure 6:
FIG. 6 illustrates the data packet from FIG. 5 which has been equalized to balance the number of 0's and 1's, according to an embodiment.

FIG. 6 illustrates a data packet 600 derived from the data packet 500 in FIG. 5, according to an embodiment. The data packet 600 is shown including data (e.g., raw data) 601 and ECC 602. The data packet 600 has been equalized so as to balance the number of 0's and 1's in the data 601. For example, the equalization process described in FIG. 3 may be performed on the data packet 500 shown in FIG. 5 in order to generate the equalized data packet 600 having a balanced number of 0's and 1's in the data 601. For example, as shown, the data 601 includes five 1's and five 0's. It should be appreciated that in certain embodiments the equalization process may be performed on the entire data packet 600, including the bits in the ECC 602.

Figure 7:
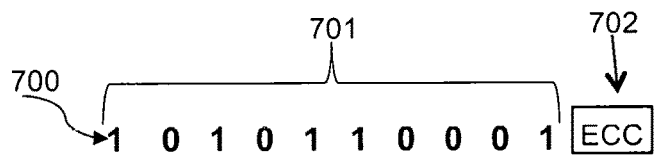
FIG. 7 illustrates another exemplary data packet to be grouped with the data packet in FIG. 6, according to an embodiment.

FIG. 7 illustrates another data packet 700 that has been equalized and that may be grouped with the equalized packet 600 in FIG. 6 for programming into a wordline, according to an embodiment. The equalized data packet 700 is shown including data (e.g., raw data) 701 and ECC 702. As shown, the data 701 includes a balanced number of 0's and 1's. It should be appreciated that in certain embodiments the equalization process may be performed on the entire data packet 700, including the bits in the ECC 702, before being grouped with the equalized packet 600.

Figure 8:
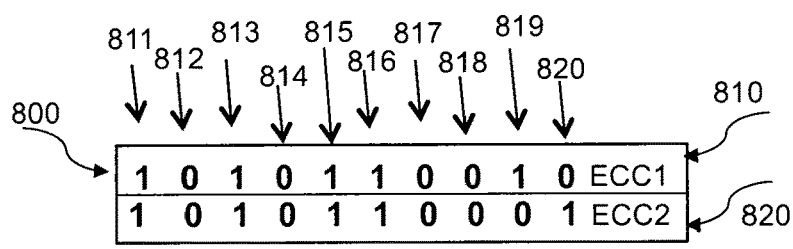
FIG. 8 illustrates the assembly and grouping of data packets from FIGS. 6 and 7 into a wordline 800.

FIG. 8 illustrates the assembly and grouping of data packets 600 and 700 from respective FIGS. 6 and 7 into a wordline 800, according to an embodiment. The wordline 800 represents the programming of the data packets 600 and 700 from FIG. 6 and FIG. 7 without (or before) any charge optimization, according to an embodiment. The wordline 800 is shown including an upper page 810 and a lower page 820. The data packets 600 and 700 are assembled so as to be programmed as the upper page 810 and lower page 820, respectively, in the wordline 800. The wordline 800 shows ten memory cells 811, 812, 813, 814, 815, 816, 817, 818, 819, and 820 that each store two bits per cell. The use of 2 bits per cell is just an illustration and is not limiting. It should be appreciated that other numbers of bits per cell can be implemented in a similar manner in other embodiments. For example, three equalized data packets may be programmed into three pages of a wordline to provide memory cells with 3-bits per cell, or 4 pages in a 4-bit per cell memory, etc.

It should be appreciated that in certain embodiments the equalization process may be performed on the entire data packets 600 and 700, including the bits in the ECC 602 and the bits in the ECC 702. In such case, ECC1 and ECC2 would reflect the equalized bits of ECC 602 and 702, respectively.

Figure 9:
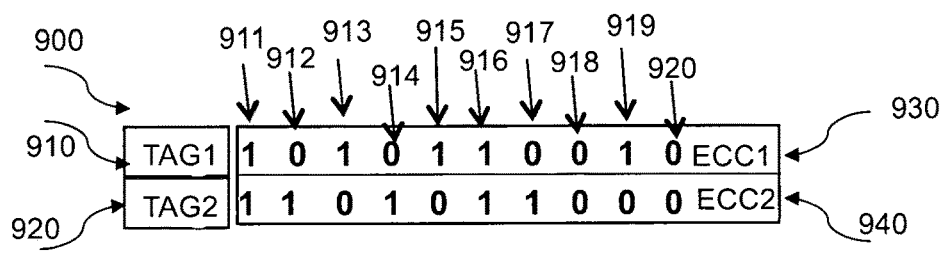
FIG. 9 illustrates a wordline with the charge optimized data packets, according to an embodiment.

FIG. 9 illustrates a programmed wordline 900 where certain bits in the two data packets 600 and 700 shown in FIG. 8 have been shuffled to optimize the energy stored in the wordline 900, according to certain embodiments. Bits in a data packet may be shuffled by moving one or more of the bits to different cells within the data packet while maintaining an equalized data packet having a balanced number of 1's and 0's.

In an embodiment, the bits in the two data packets 600 and 700 shown in FIG. 8 may be shuffled based on specific requirements so as to minimize the condition where a cell will be programmed at the highest charge state. An example of a highest charge may be the state in which a cell is programmed with "00" values, such as the case is with flash memory for instance.

For example, some flash memory may have a highest charge state with "00" and the lowest charge state with "11", with middle charge states therebetween for "01" and "10". Therefore, the energy stored in the wordline 900 may be reduced by shuffling bits such that one or more cells having the highest energy state "00" are changed to a lower energy state, such as "11", "01", or "10". Changing from the highest energy state (e.g., "00") to the lowest energy state (e.g., "11") in a cell will result in the greatest reduction in energy stored for that cell. Furthermore, changing from a middle charge state (e.g., "10 or "01") to the lowest charge state (e.g., "11") in a cell will result in a reduction in stored energy.

It should be appreciated that the levels of charge states may vary in different embodiments without compromising the underlying principles of the techniques described herein. For example, some flash memory may have the highest charge state with "00" and the lowest charge state with "01" or "10", with a middle charge state therebetween for "11". A similar energy reduction breakdown can be applied here with the new charge states. It should also be appreciated that the techniques described herein may also be applicable to all nonvolatile memory, such as Flash, MRAM, ReRAM, RRam, 2D and 3D nonvolatile memory, and variations thereof.

In FIG. 9, the wordline 900 is shown including upper page 930 and a lower page 940. The data packet 600 is programmed in upper page 930 without shuffling any of the bits in cells 911, 912, 913, 914, 915, 916, 917, 918, 919, and 920. The data packet 700 is programmed in lower page 940 such that some of the bits have been shuffled to a different cell to reduce a cell's stored energy, while still maintaining a balanced data packet. For example, the "1" bit in cell 813 for data packet 700 has been shuffled with the "0" bit in cell 812, resulting in a "1" bit shown in cell 912 and a "0" bit shown in cell 913. In this way, the charged state of "00" in cell 812 has been reduced to a charged state of "01" as shown in cell 912. A similar shuffling has been performed for the bits in cells 814 and 815, resulting in the bits shown in cells 914 and 915.

It should be appreciated that while the bits in cells 817 and 820 have been shuffled in a manner that maintains a generally equivalent stored energy for the bits in the resulting cells 917 and 920, the overall energy stored for the wordline 900 is still optimized (or reduced) from the energy stored for the wordline 800. Alternatively for example, if instead the "1" bit in cell 811 for data packet 700 is shuffled with the "0" bit in cell 818 (resulting in a "1" bit in cell 918 and a "0" bit shown in cell 911), then the charged state of "00" in cell 818 would have been reduced to a charged state of "01" in cell 918. Such alternative shuffling may even result in greater optimization since an additional charged state of "00" would have been eliminated.

It should be appreciated that in certain embodiments, the optimization of the total (or overall) energy stored for a wordline may be computed for various combinations and permutations to result in the greatest reduction of total energy stored. In this way, the final shuffling configuration of the data packets may rely on how large of a reduction in energy is provided for changes from a middle charge state to the lowest charge state in a cell. Therefore, in other embodiments, the bits in the two data packets 600 and 700 shown in FIG. 8 may be shuffled based on specific requirements so as to minimize the overall energy stored for all charges in cells in a wordline, rather than primarily focusing on reducing the highest charge states.

It should be appreciated that the shuffling of bits may also be performed on the entire data packet, including the bits in the ECC. For example, the bits in the ECC1 and ECC2 in FIG. 8 may also be shuffled in a similar matter to provide an optimized arrangement of bits for the ECC1 and ECC2 in FIG. 9.

While only the bits in the data packet 700 were shown or described as shuffled in FIG. 9, it should be appreciated that bits in data packet 600, or bits in both data packets 600 and 700, may be shuffled in other embodiments without compromising the underlying principles of the techniques described herein. It should also be appreciated that the techniques described herein may be applicable to not just a single wordline, but also to a group of wordlines, blocks of wordlines, or clusters of wordlines.

The wordline 900 shown in FIG. 9 also includes tag 910 (shown as TAG1) added to the programmed data packet in the upper page 930, and tag 920 (shown as TAG2) added to the programmed data packet in the lower page 940. Each of the tags 910 and 920 may include information as to the equalization and charge optimization programmed for the data packets contained in the upper page 930 and lower page 940, respectively. The information in tags 910 and 920 may include decoding instructions to decode the programmed wordline 900.

Figure 10:
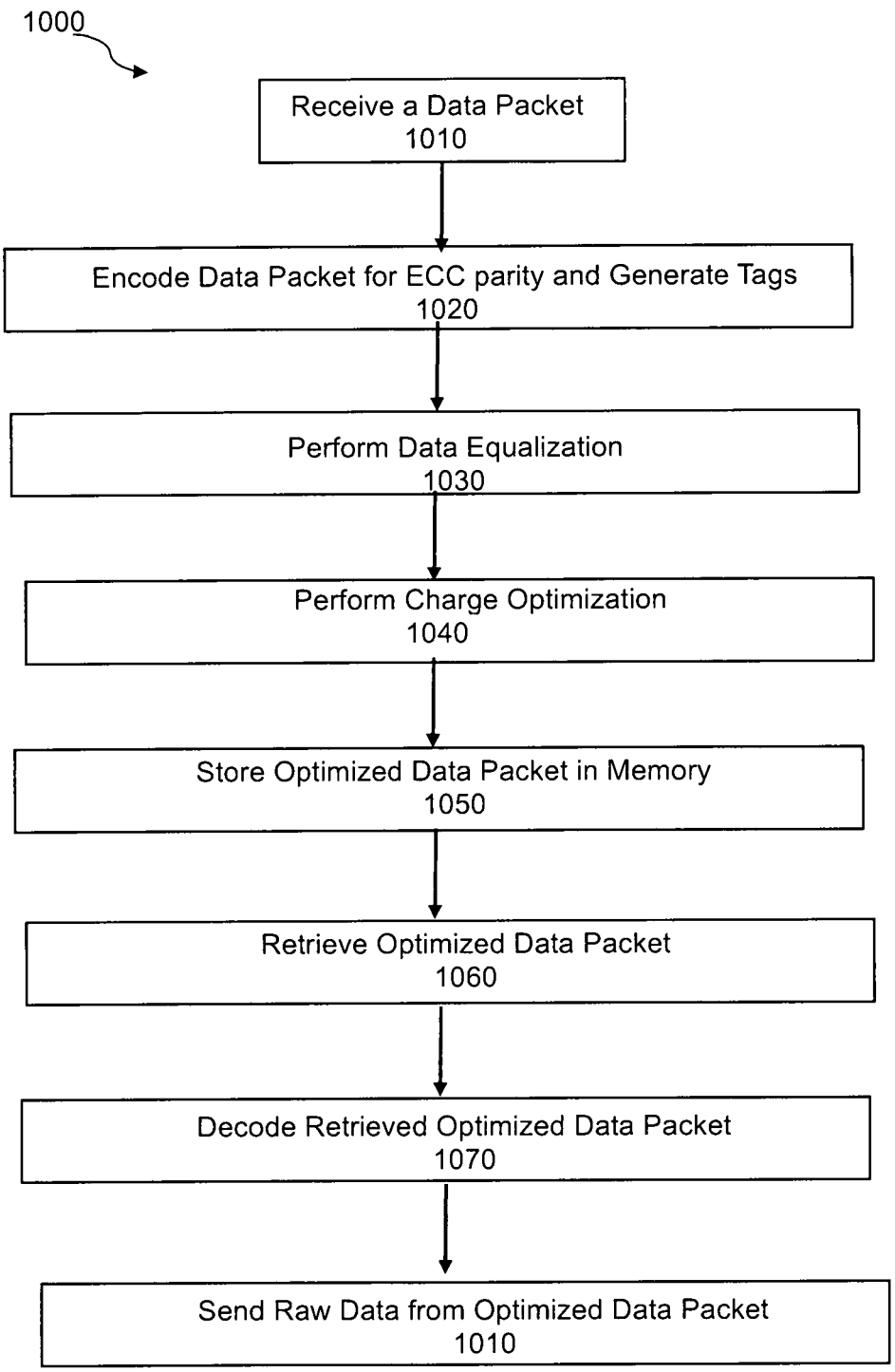
FIG. 10 a flow chart for an exemplary method 1000 to optimize the energy stored in memory, according to an embodiment.

FIG. 10 illustrates a flow chart for an exemplary method 1000 to optimize the energy stored in memory, according to an embodiment. The components and techniques described herein for FIGS. 1-9 are also equally applicable to the discussion herein for the example method 1000 of FIG. 10. For the sake of brevity and clarity, the features and functions of the common components and operations described for the method 1000 of FIG. 10 are not repeated here. It should be appreciated that the method 1000 is exemplary and non-limiting, and that other variations may be implemented in other embodiments, such as those described herein for FIGS. 1-9.

At block 1010 of the method 1000, a data packet is received. For example, the controller 130 may receive a data packet from the host accessing device 161 for storing in memory 104 of the memory device 103. At block 1020, the data packet is encoded for ECC parity and appropriate tags generated and added to the data packet, such as described for the ECC engine module 151 and 250 shown in FIGS. 1 and 1, respectively, for instance.

At block 1030, data equalization may be performed on the encoded data packet to balance the 1's and 0's in the data packet, such as described for the data formatter 153 of FIG. 1, the data equalizer module 300 of FIG. 3, for instance. The data may then reside in a data register until charge optimization is to be performed. At block 1040, the charge optimization is initiated. The equalized data packet from block 1030 and one or more additional equalized data packets (e.g., as similarly provided in blocks 1010 through 1030) are assembled, each in a different page of the memory (e.g., in pages of a wordline). The equalized data packets are shuffled to reduce energy stored in one or more cells in the memory (e.g., a wordline, block of wordlines, or cluster of wordlines) while maintaining the equalization, resulting in an optimized data packet. At block 1040, tags are generated for the optimized data packet provided at block 1030. The tags are added to the optimized data packet and may be used for decoding purposes. The tags may also include decoding instructions for the encoded ECC parity of block 1020. At block 1050, the optimized data packet is stored in memory. The blocks 1030 through 1050 may be performed by the data formatter 153 of FIG. 1 and the charge optimization module 400 of FIG. 4, for instance.

At block 1060, the optimized data packet is retrieved. For example, a host accessing device may request data (e.g., raw data) stored in the optimized data packet in memory. At block 1070, the stored optimized data packet is decoded using the tags that were generated and added to the optimized data packet in block 1040. The block 1070 may be performed by the data formatter 153 of FIG. 1 and the decoder for charge optimization module 220 of FIG. 2, for instance. At block 1080 the raw data requested by the host accessing device is sent to the host accessing device.

Example Embodiments

In certain aspects of the present disclosure, data storage devices are provided that include a memory device and controller. The memory device includes memory. The controller is communicatively coupled to the memory device and includes logic to: assemble a plurality of equalized data packets such that each of the equalized data packets is for a different page in a plurality of pages of a memory; shuffle one or more bits in the assembled plurality of equalized data packets to form an optimized data packet; and store the optimized data packet in the memory. The shuffling of the one or more bits reduces an amount of energy to be stored in the memory while maintaining equalization.

In certain embodiments, each of the equalized data packets is for a different page in a plurality of pages of a wordline, block of wordlines, or cluster of blocks of wordlines in the memory. The shuffling of the one or more bits reduces the amount of energy to be stored in the wordline, block of wordlines, or cluster of blocks of wordlines while maintaining equalization.

In certain embodiments, the controller further includes logic to generate one or more tags, and store the one or more tags in the optimized data packet. The one or more tags include decoding instructions based on the optimized data packet. In an embodiment, the controller further includes logic to: receive a plurality of data packets; and equalize each data packet of the plurality of data packets to form the plurality of equalized data packets. In an embodiment, the equalizing of each data packet includes balancing 1's and 0's in at least raw data of each equalized data packet. In an embodiment, the controller further includes logic to encode ECC parity in the plurality of data packets. The generated one or more tags include decoding instructions based on the encoded ECC parity in the plurality of data packets. In an embodiment, the controller further includes logic to: retrieve the stored wordline from the memory device; and decode the stored optimized data packet based on the generated one or more tags stored in the optimized data packet.

In certain embodiments, the assembled plurality of equalized data packets includes a plurality of memory cells in the memory. Each of the memory cells is configured to store a number of bits per cell. The number of bits per cell equals a number of pages in the plurality of pages.

In certain aspects of the present disclosure, a system is provided that includes a data storage device and a host accessing device communicatively coupled to the data storage device. The host accessing device is configured to issue commands to the data storage device to read data from or write data to the memory device. The data storage device includes a memory device including memory, and a controller communicatively coupled to the memory device. The controller includes logic to assemble a plurality of equalized data packets such that each of the equalized data packets is for a different page in a plurality of pages of a memory; shuffle one or more bits in the assembled plurality of equalized data packets to form an optimized data packet, and store the optimized data packet in the memory. The shuffling of the one or more bits reduces an amount of energy to be stored in the memory while maintaining equalization; and In certain embodiments, the controller further includes logic to: generate one or more tags, and store the one or more tags in the optimized data packet. The one or more tags include decoding instructions based on the optimized data packet. In an embodiment, the controller further includes logic to: receive a plurality of data packets; equalize each data packet of the plurality of data packets to form the plurality of equalized data packets; upon request from the host accessing device, retrieve the optimized data packet stored in the memory; decode the stored optimized data packet based on the generated one or more tags stored in the optimized data packet; and send raw data from the optimized data packet to the host accessing device. In an embodiment, the controller further includes logic to encode ECC parity in the plurality of data packets. The generated one or more tags include decoding instructions based on the encoded ECC parity in the plurality of data packets. In an embodiment, the assembled plurality of equalized data packets includes a plurality of memory cells in the memory. Each of the memory cells is configured to store a number of bits per cell. The number of bits per cell equals a number of pages in the plurality of pages. In an embodiment, each of the equalized data packets is for a different page in a plurality of pages of a wordline, block of wordlines, or cluster of blocks of wordlines in the memory. The shuffling of the one or more bits reduces the amount of energy to be stored in the wordline, block of wordlines, or cluster of blocks of wordlines while maintaining equalization.

In certain aspects of the present disclosure, methods are provided that include: assembling, by a controller, a plurality of equalized data packets such that each of the equalized data packets is for a different page in a plurality of pages of a memory; shuffling, by the controller, one or more bits in the assembled plurality of equalized data packets to form an optimized data packet, and storing, by the controller, the optimized data packet in the memory. The shuffling of the one or more bits reduces an amount of energy to be stored in the memory while maintaining equalization.

In certain embodiments, the method further includes: generating, by the controller, one or more tags, and storing, by the controller, the one or more tags in the optimized data packet. The one or more tags includes decoding instructions based on the optimized data packet.

In certain embodiments, the method further includes: receiving, by the controller, a plurality of data packets; encoding, by the controller, ECC parity in the plurality of data packets; and equalizing, by the controller, each data packet of the plurality of data packets to form the plurality of equalized data packets.

In certain embodiments, the method further includes: retrieving, by the controller, the optimized data packet stored in the memory upon request from a host accessing device; decoding, by the controller, the stored optimized data packet based on the generated one or more tags stored in the optimized data packet; and sending raw data from the optimized data packet to the host accessing device.

In certain embodiments, each of the equalized data packets is for a different page in a plurality of pages of a wordline, block of wordlines, or cluster of blocks of wordlines in the memory. The shuffling of the one or more bits reduces the amount of energy to be stored in the wordline, block of wordlines, or cluster of blocks of wordlines while maintaining equalization. The assembled plurality of equalized data packets includes a plurality of memory cells in the memory. Each of the memory cells is configured to store a number of bits per cell; and wherein the number of bits per cell equals a number of pages in the plurality of pages.

Throughout the foregoing description, and for the purposes of explanation, numerous specific details are set forth in order to provide a thorough understanding of the described techniques. It will be apparent, however, to one skilled in the art that these techniques can be practiced without some of these specific details. Although various embodiments that incorporate these teachings have been shown and described in detail, those skilled in the art could readily devise many other varied embodiments or mechanisms to incorporate these techniques. Also, embodiments can include various operations as set forth above, fewer operations, or more operations; or operations in an order. Accordingly, the scope and spirit of the invention should only be judged in terms of any accompanying claims that may be appended, as well as any legal equivalents thereof.

Reference throughout the specification to "one embodiment" or "an embodiment" is used to mean that a particular feature, structure or characteristic described in connection with an embodiment is included in at least one embodiment. Thus, the appearance of the expressions "in one embodiment" or "in an embodiment" in various places throughout the specification are not necessarily referring to the same embodiment. Further, the particular features, structures or characteristics may be combined in any suitable manner in one or several embodiments. Although the present invention has been described above with reference to specific embodiments, it is not intended to be limited to the specific form set forth herein. Rather, embodiments other than those specific described above are equally possible within the scope of any accompanying claims. Moreover, it should be appreciated that the terms "comprise/comprises" or "include/includes", as used herein, do not exclude the presence of other elements or steps. Furthermore, although individual features may be included in different claims, these may possibly advantageously be combined, and the inclusion of different claims does not imply that a combination of features is not feasible and/or advantageous. In addition, singular references do not exclude a plurality. Finally, reference signs in the claims are provided merely as a clarifying example and should not be construed as limiting the scope of the claims in any way.

Various components and modules described herein may include software, hardware, or a combination of software and hardware. The components and modules may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein. It should also be appreciated that one or more modules may be combined to perform the functionalities of each module, or that the functionalities of one module may be broken up into two modules, without compromising the underlying principles of the techniques described in the present disclosure.

A computer or machine readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

What is claimed is:

1. A data storage device, comprising:
a memory device comprising memory; and
a controller communicatively coupled to the memory device and comprising logic to:
assemble a plurality of equalized data packets such that each of the equalized data packets is for a different page in a plurality of pages of a memory;
shuffle one or more bits in the assembled plurality of equalized data packets to form an optimized data packet, wherein the shuffling of the one or more bits reduces an amount of energy to store the plurality of equalized data packets in the memory while maintaining equalization; and
store the optimized data packet in the memory.

2. The data storage device of claim 1, wherein each of the equalized data packets is for a different page in a plurality of pages of a wordline, block of wordlines, or cluster of blocks of wordlines in the memory; and wherein the shuffling of the one or more bits reduces the amount of energy to be stored in the wordline, block of wordlines, or cluster of blocks of wordlines while maintaining equalization.

3. The data storage device of claim 1, wherein the controller further comprises logic to:
generate one or more tags, wherein the one or more tags comprise decoding instructions based on the optimized data packet; and
store the one or more tags in the optimized data packet.

4. The data storage device of claim 3, wherein the controller further comprises logic to:
receive a plurality of data packets; and
equalize each data packet of the plurality of data packets to form the plurality of equalized data packets.

5. The data storage device of claim 4, wherein the equalizing of each data packet comprises balancing 1's and 0's in at least raw data of each equalized data packet.

6. The data storage device of claim 4, wherein the controller further comprises logic to:
encode ECC parity in the plurality of data packets, wherein the generated one or more tags comprise decoding instructions based on the encoded ECC parity in the plurality of data packets.

7. The data storage device of claim 6, wherein the controller further comprises logic to:
retrieve the stored optimized data packet from the memory device; and
decode the stored optimized data packet based on the generated one or more tags stored in the optimized data packet.

8. The data storage device of claim 4, wherein the controller further comprises logic to:
retrieve the stored optimized data packet from the memory device; and
decode the stored optimized data packet based on the generated one or more tags stored in the optimized data packet.

9. The data storage device of claim 1, wherein the assembled plurality of equalized data packets comprises a plurality of memory cells in the memory; wherein each of the memory cells is configured to store a number of bits per cell; and wherein the number of bits per cell equals a number of pages in the plurality of pages.

10. The data storage device of claim 1, wherein the data storage device includes or corresponds to a solid-state drive (SSD).

11. A system, comprising:
a data storage device comprising:
a memory device comprising a memory; and
a controller communicatively coupled to the memory device, wherein the controller comprises logic to:
assemble a plurality of equalized data packets such that each of the equalized data packets is for a different page in a plurality of pages of a memory;
shuffle one or more bits in the assembled plurality of equalized data packets to form an optimized data packet, wherein the shuffling of the one or more bits reduces an amount of energy to store the plurality of equalized data packets in the memory while maintaining equalization; and
store the optimized data packet in the memory; and
a host accessing device communicatively coupled to the data storage device, wherein the host accessing device is configured to issue commands to the data storage device to read data from or write data to the memory device.

12. The system of claim 11, wherein the controller further comprises logic to:
generate one or more tags, wherein the one or more tags comprise decoding instructions based on the optimized data packet; and
store the one or more tags in the optimized data packet.

13. The system of claim 12, wherein the controller further comprises logic to:
receive a plurality of data packets;
equalize each data packet of the plurality of data packets to form the plurality of equalized data packets;
upon request from the host accessing device, retrieve the optimized data packet stored in the memory;
decode the stored optimized data packet based on the generated one or more tags stored in the optimized data packet; and
send raw data from the optimized data packet to the host accessing device.

14. The system of claim 13, wherein the controller further comprises logic to:
encode ECC parity in the plurality of data packets, wherein the generated one or more tags comprise decoding instructions based on the encoded ECC parity in the plurality of data packets.

15. The system of claim 14, wherein the assembled plurality of equalized data packets comprises a plurality of memory cells in the memory; wherein each of the memory cells is configured to store a number of bits per cell; and wherein the number of bits per cell equals a number of pages in the plurality of pages.

16. The system of claim 15, wherein each of the equalized data packets is for a different page in a plurality of pages of a wordline, block of wordlines, or cluster of blocks of wordlines in the memory; and wherein the shuffling of the one or more bits reduces the amount of energy to be stored in the wordline, block of wordlines, or cluster of blocks of wordlines while maintaining equalization.

17. The system of claim 14, wherein the data storage device includes or corresponds to a solid-state drive (SSD).

18. A method, comprising:
assembling, by a controller, a plurality of equalized data packets such that each of the equalized data packets is for a different page in a plurality of pages of a memory;
shuffling, by the controller, one or more bits in the assembled plurality of equalized data packets to form an optimized data packet, wherein the shuffling of the one or more bits reduces an amount of energy to store the plurality of equalized data packets in the memory while maintaining equalization; and
storing, by the controller, the optimized data packet in the memory.

19. The method of claim 18, further comprising:
generating, by the controller, one or more tags, wherein the one or more tags comprise decoding instructions based on the optimized data packet; and
storing, by the controller, the one or more tags in the optimized data packet.

20. The method of claim 18, further comprising:
receiving, by the controller, a plurality of data packets;
encoding, by the controller, ECC parity in the plurality of data packets; and
equalizing, by the controller, each data packet of the plurality of data packets to form the plurality of equalized data packets.

21. The method of claim 18, further comprising:
generating, by the controller, one or more tags, wherein the one or more tags comprise decoding instructions based on the optimized data packet;
storing, by the controller, the one or more tags in the optimized data packet;
retrieving, by the controller, the optimized data packet stored in the memory upon request from a host accessing device;
decoding, by the controller, the stored optimized data packet based on the generated one or more tags stored in the optimized data packet; and
sending raw data from the optimized data packet to the host accessing device.

22. The method of claim 18, wherein each of the equalized data packets is for a different page in a plurality of pages of a wordline, block of wordlines, or cluster of blocks of wordlines in the memory; wherein the shuffling of the one or more bits reduces the amount of energy to be stored in the wordline, block of wordlines, or cluster of blocks of wordlines while maintaining equalization; wherein the assembled plurality of equalized data packets comprises a plurality of memory cells in the memory; wherein each of the memory cells is configured to store a number of bits per cell; and wherein the number of bits per cell equals a number of pages in the plurality of pages.

23. The method of claim 21, further comprising:
receiving, by the controller, a plurality of data packets;
encoding, by the controller, ECC parity in the plurality of data packets; and
equalizing, by the controller, each data packet of the plurality of data packets to form the plurality of equalized data packets.

* * * * *